United States Patent
Van De Moosdijk et al.

(10) Patent No.: US 7,408,624 B2
(45) Date of Patent: Aug. 5, 2008

(54) LITHOGRAPHIC APPARATUS AND DEVICE MANUFACTURING METHOD

(75) Inventors: Michael Josephus Evert Van De Moosdijk, Eindhoven (NL); Klaus Simon, Eindhoven (NL); Wilhelmus Johannes Maria De Laat, Heeswijk-Dinther (NL)

(73) Assignee: ASML Netherlands B.V., Veldhoven (NL)

( * ) Notice: Subject to any disclaimer, the term of this patent is extended or adjusted under 35 U.S.C. 154(b) by 336 days.

(21) Appl. No.: 11/170,735

(22) Filed: Jun. 30, 2005

(65) Prior Publication Data

US 2007/0002303 A1    Jan. 4, 2007

(51) Int. Cl.
*G03B 27/58*  (2006.01)
*G03B 27/42*  (2006.01)
(52) U.S. Cl. .......................................... 355/72; 355/53
(58) Field of Classification Search .................. 355/53, 355/72–76; 310/10, 12; 378/34, 35; 361/234
See application file for complete search history.

(56) References Cited

U.S. PATENT DOCUMENTS

| | | | | |
|---|---|---|---|---|
| 6,164,633 | A  * | 12/2000 | Mulligan et al. | 269/21 |
| 6,583,858 | B2 * | 6/2003  | van Schaik et al. | 355/72 |
| 6,822,730 | B2   | 11/2004 | Krikhaar et al. | |
| 2004/0145751 | A1 * | 7/2004 | Binnard | 356/500 |
| 2005/0117203 | A1 * | 6/2005 | Dieckmann et al. | 359/350 |

* cited by examiner

*Primary Examiner*—Hung Henry Nguyen
(74) *Attorney, Agent, or Firm*—Pillsbury Winthrop Shaw Pittman, LLP

(57) ABSTRACT

A lithographic apparatus includes a substrate table constructed to hold a first substrate of a first type, the first substrate having a polished surface; and a projection system configured to project a patterned radiation beam onto a target portion of a substrate. The polished surface supports a second substrate of a second type and the projection system is configured to project the patterned radiation beam onto the second substrate.

21 Claims, 14 Drawing Sheets

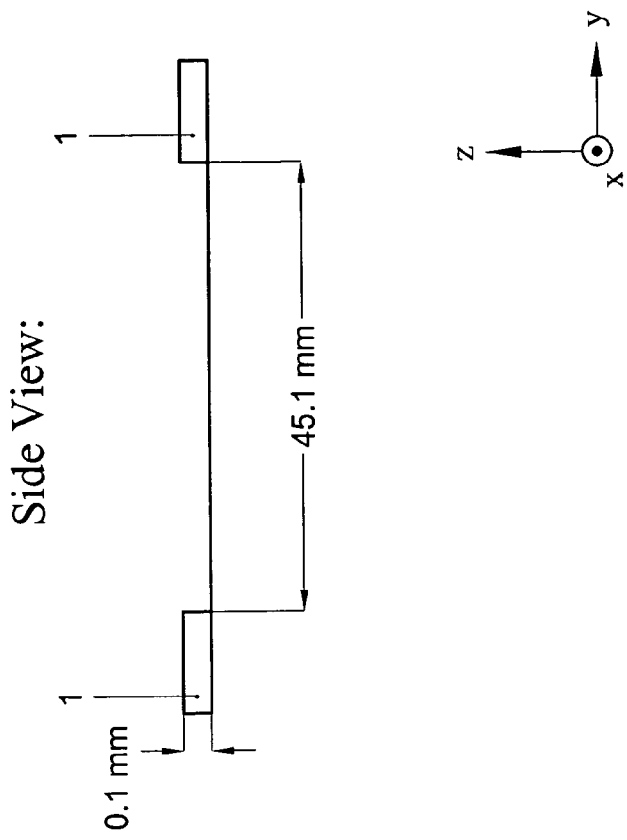
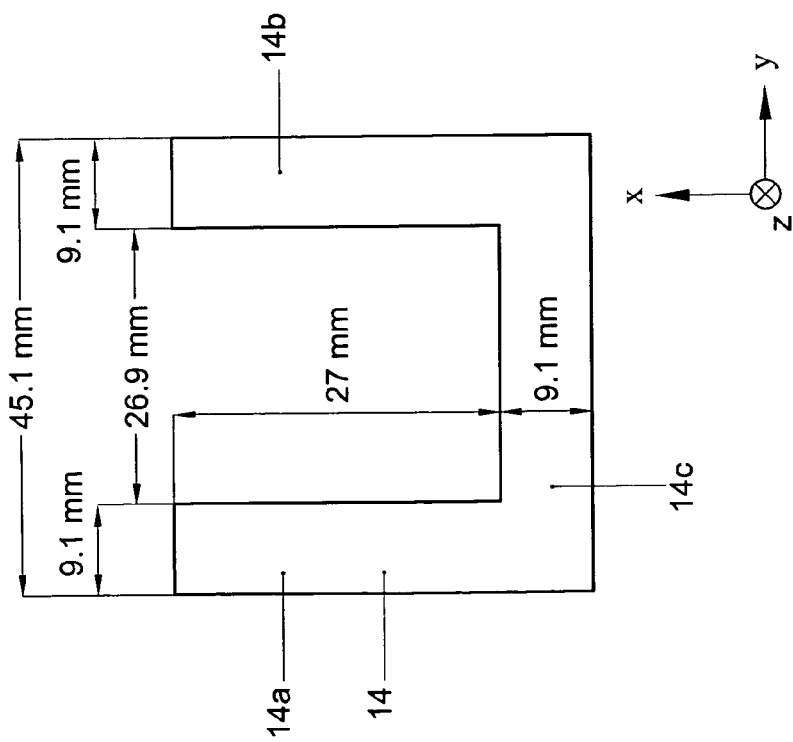

LITHOGRAPHIC APPARATUS AND DEVICE MANUFACTURING METHOD

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In a lithographic apparatus, the substrate table is generally designed to hold substrates that have standard sizes and shapes. Typically, the smallest substrate than can be held is a circular substrate with a diameter of 75 mm (approximately 3 inches). Substrate tables are generally designed so as to have a holder tailored to standard substrates; the holder should be capable of holding the substrate immobile, and designing such holders for a standard size/type of substrate allows the design to be optimized. Various other types of substrate supporting tables—such as found in auxiliary apparatus, substrate handling components, substrate transport devices, etc are also generally designed to handle substrates of a standard size and shape.

However, there are occasions when it is desirable to process a substrate that is either not of a standard size or not of a standard shape. For example, certain substrates, such as Inp, GaAs and SiC substrates generally have a diameter of 50 mm (approximately 2 inches), which is too small for most conventional substrate holders. Also, substrates may have different shapes than the standard. Typically, substrates are fully rounded or may be rounded with a flat portion along part of the circumference. However, other shapes, such as squares, rectangles and quarters of a rounded substrate of various sizes may be desirable. Moreover, it may be desirable to process irregular shapes, each of which may be unique, for example, as a result of breakage of a larger substrate into irregular pieces. However, it very expensive to design and build a substrate table and handling components specifically tailored to such non-standard substrates. Further, a user desires to use a single lithographic apparatus to be able to expose a variety of substrates, including non-standard substrates.

To address the problem of handling non-standard substrates, it is known to provide an etched recess in a standard substrate which is held by the holder on the substrate table. The non-standard substrate is then disposed in the recess. In this way, the standard substrate acts as a "host" or carrier for the non-standard substrate. However, it has been found that due to limiting tolerances in the etching process, it is difficult to consistently etch a perfect recess. The recess may often include defects. For example, the bottom surface of the recess, which acts as the supporting surface for the non-standard substrate, is may not be flat. Further, the sidewalls of the recess may not be perpendicularly oriented with respect to the bottom surface, which may lead to alignment problems due to misplacement of the non-standard substrate. Moreover, even if the desired shape is obtained, the carrier substrate may be relatively brittle, for example a silicon wafer. Thus, placing a non-standard wafer in and out of the recess may over time result in chipping pieces off the sides of the recess, which results in contamination.

SUMMARY

It is desirable to process a variety of substrate sizes including non-standard substrates (substrates of a "second type") through a lithography apparatus and respective pre and post exposure handling stations which are designed to hold and process a particular size and shape of substrate (substrates of a "first type") without making major modifications to the apparatus or handling stations. It is further desirable to improve alignment accuracy of the non-standard substrates in the lithographic apparatus. It is further desirable to reduce contamination in the lithographic apparatus and pre and post exposure handling stations.

According to an aspect of the invention, there is provided a lithographic apparatus comprising: substrate table constructed to hold a first substrate of a first type, the first substrate having a polished surface; and a projection system configured to project the patterned radiation beam onto a target portion of a substrate, wherein the polished surface supports a second substrate of a second type and the projection system is configured to project the patterned radiation beam onto the second substrate.

According to an aspect of the invention, there is provided a substrate processing apparatus comprising: a substrate table constructed to hold a first substrate of a first type, the first substrate having a polished surface; and a processing system arranged to perform at least one of a handling and treatment process on at least a portion of a substrate, wherein the polished surface supports a second substrate of a second type and the processing system is configured to process or treat the second substrate.

According to an aspect of the invention, there is provided a device manufacturing method comprising projecting a patterned beam of radiation onto a substrate of a second type, wherein the substrate is disposed on a polished surface of a substrate of a first type.

According to an aspect of the invention, there is provided a device manufacturing method comprising transferring a pattern from a patterning device onto a substrate, wherein the substrate is disposed on a polished surface of a substrate of a first type.

According to an aspect of the invention, there is provided a lithographic projection apparatus arranged to project a pattern from a patterning device onto a substrate of a second type, wherein the substrate is disposed on a polished surface of a substrate of a first type.

According to an aspect of the invention, there is provided a lithographic apparatus arranged to transfer a pattern from a patterning device onto a substrate of a second type, wherein the substrate is disposed on a polished surface of a substrate of a first type.

According to an aspect of the invention, there is provided a first substrate for use in a lithographic apparatus, the substrate having a polished surface, the first substrate comprising a recess configured to receive a second substrate holder, so that a second substrate may be held in a predetermined location on the polished surface.

According to an aspect of the invention, there is provided a method of mounting a second substrate on a first substrate having a polished upper surface, the method comprising etching a recess in the first substrate, disposing a holder for holding the second substrate in the recess, disposing the second substrate against the holder on the polished surface.

According to an aspect of the invention, there is provided a lithographic apparatus comprising: projection system configured to project a patterned radiation beam onto a target portion of a substrate, and a substrate supporting means for supporting the substrate, the substrate supporting means having an upper surface, the upper surface comprising a recess in which a substrate holder and the substrate are disposed, so that the substrate is supported and held in a predetermined position by the holder to allow the target portion to be projected onto by the projection system.

According to an aspect of the invention, there is provided a semiconductor substrate having a polished surface, a recess being provided in said surface, said recess comprising a substantially L-shaped portion.

According to an aspect of the invention, there is provided a substrate holder comprising a first substrate adapted for placement on a substrate table of a lithographic apparatus, said substrate having a polished surface; and an object provided on said polished surface, or in a recess provided in said polished surface, said object being constructed and arranged to surround at least part of a second substrate to be placed on said polished surface.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 5a depicts a top view of a recess area according to an embodiment of the invention;

FIG. 5b depicts a side view of the recess area depicted in FIG. 5a;

FIG. 11a depicts a top view of the recess area according to the embodiment of the invention depicted in FIG. 9;

FIG. 11b depicts a side view of the recess area depicted in FIG. 11a;

FIG. 13b depicts a cross section of the embodiment shown in FIG. 13a;

DETAILED DESCRIPTION

Figure 1:
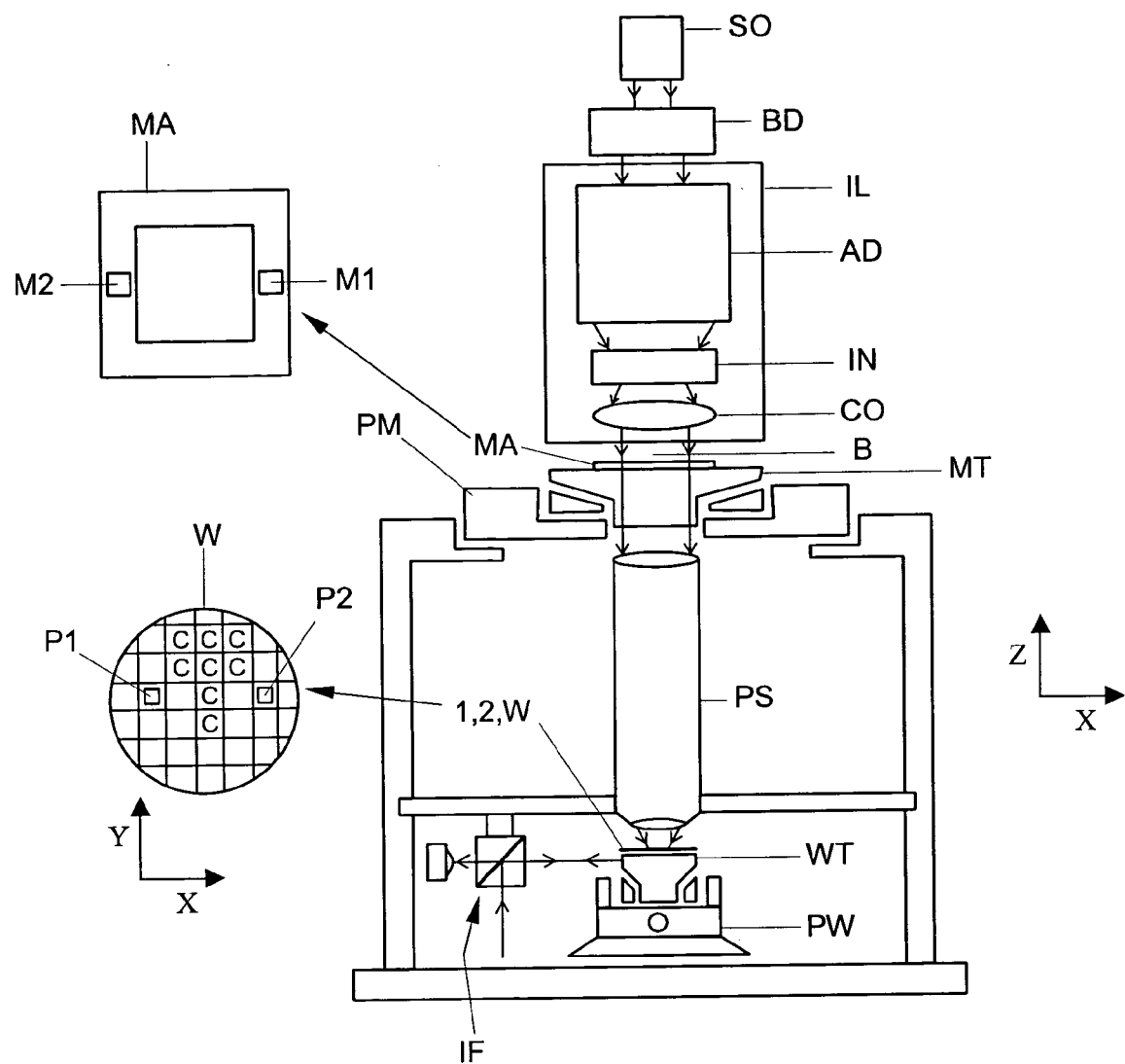
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation, DUV, EUV or x ray radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) 1, 2, W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate 1, 2, W. The substrates 1, 2, W are described in further detail below.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
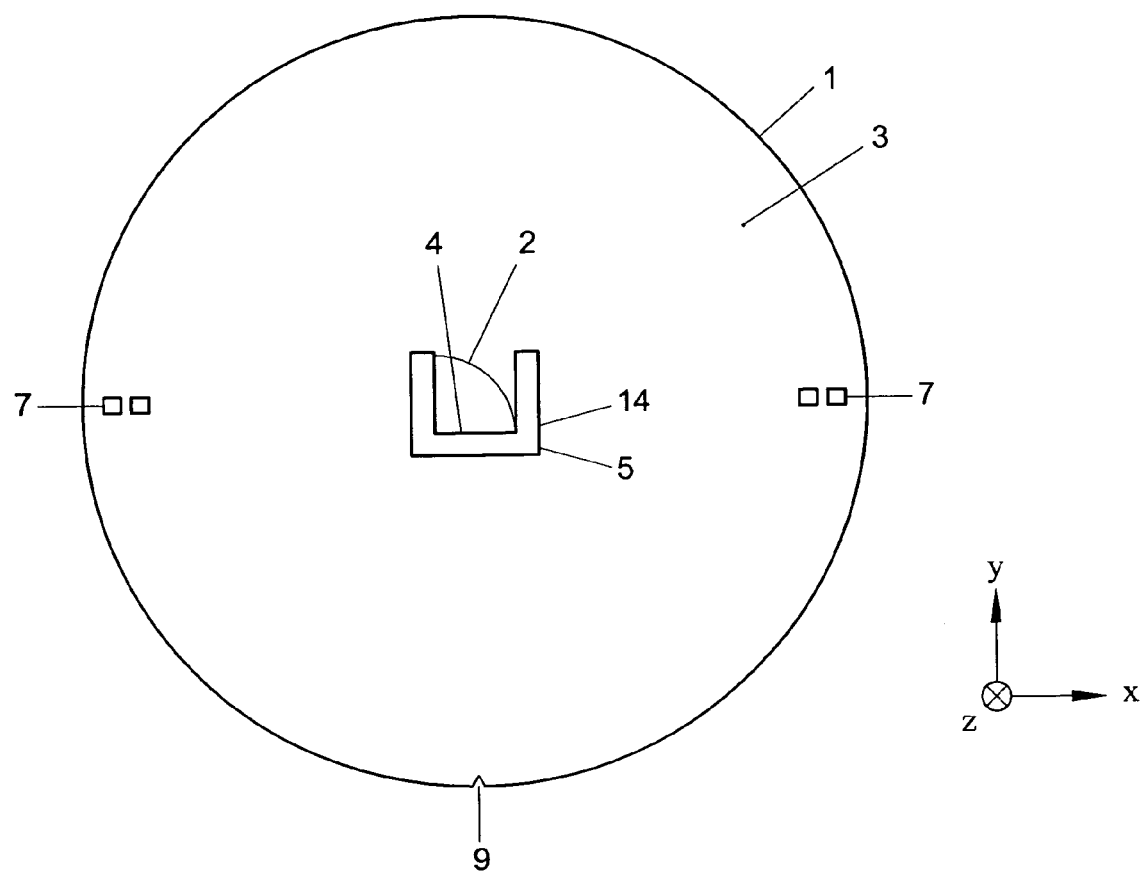
FIG. 2 depicts a plan view of a first substrate according to an embodiment of the invention.

FIG. 2 depicts a plan view of a first substrate according to an embodiment of the invention. The present invention makes it possible to expose and align non-standard substrates on a lithography apparatus without requiring major modification of the apparatus. This increases the versatility of the apparatus. Up to now, customers working with non-standard substrates, for example, in the photonics industry and in research centers, were dependent on contact lithography for making repeatable patterns on substrates. This has limited resolution capabilities and poor wafer uniformity, which causes too many deviations in high-end developments. The invention enables use of a lithography apparatus on substrates whose dimensions are beyond contact lithography capabilities. Thus, substrates which previously have only been able to be processed using contact lithography, can now be processed with increased resolution, less distortion and with improved overlay. Further the costs of certain wafer types makes it such that by making it possible to use wafers which have broken, costs are saved.

With reference to FIGS. 2 to 8, the holder comprises a first portion which extends in a first direction and a second and third portions which adjoin the first portion at opposite ends and extend in substantially the same second direction ("U" shaped), wherein the portions have a predetermined thickness extending in a third direction.

FIG. 2 shows a first substrate 1. In an embodiment, the first substrate 1 has a polished surface 3. In an embodiment, the first substrate 1 is adapted for use in a given lithographic apparatus. The thickness of the substrate may vary and, to an extent, may depend, e.g., on the substrate material and/or the substrate diameter. In one embodiment, the thickness is at least 300 µm, e.g. at least 400 µm, at least 500 µm, or at least 600 µm. In one embodiment, the thickness of the substrate is at most 2500 µm, for instance at most 1750 µm, at most 1250 µm, at most 1000 µm, or at most 800 µm. The shape of the substrate may vary. In one embodiment, the substrate has a substantially circular shape, optionally with a notch and/or a flattened edge along part of its perimeter. In one embodiment, the substrate has a diameter of at least 50 mm, e.g. at least 75 mm, at least 100 mm, at least 125 mm, at least 150 mm, at least 175 mm, at least 200 mm, at least 250 mm, or at least 300 mm. In one embodiment, the wafer has a diameter of at most 500 mm, at most 400 mm, at most 350 mm, at most 300 mm, at most 250 mm, at most 200 mm, at most 150 mm, at most 100 mm, or at most 75 mm. In an embodiment, the first substrate is a semiconductor substrate, e.g. a semiconductor wafer. In one embodiment, the substrate material is selected from the group consisting of Si, SiGe, SiGeC, SiC, Ge, GaAs, InP, and InAs. In one embodiment, the wafer is a III/V compound semiconductor wafer. In one embodiment, the wafer is a silicon wafer, e.g. an 8-inch silicon wafer. The first substrate 1 is mounted in a conventional manner on the wafer table WT. The second substrate 2 may be a non-standard wafer for the given lithography apparatus. For example, a 2-inch InP wafer cut into quarters. In an embodiment, the second substrate material is selected from the group consisting of Si, SiGe, SiGeC, SiC, Ge, GaAs, InP, and InAs. In an embodiment, the second substrate is a III/V compound semiconductor substrate. The second substrate 2 is disposed on the polished surface 3 of the first substrate 1. Since the polished surface is substantially flat, it provides an excellent mounting surface. It has been found that the polished surface 3 provides an improved surface over an etched surface, due to this flatness. Thus, reproducibility is improved. The first substrate 1 acts as a host for the second substrate 2. The projection system is arranged to project the projection beam onto the second substrate 2. This may be achieved by adjusting the focus of the projection beam. Further, the leveling software may be adapted so that the level sensor spot impinges on the second substrate mounted on the first substrate, rather than on the first substrate, as is conventionally the case. Also shown in FIG. 2 is a substrate holder 5. The substrate holder serves to hold the second substrate 2 in alignment on the first substrate. The holder 5 is disposed in a recess 14 formed in the first substrate 1. In an alternative embodiment, the holder 5 is placed (e.g. glued) on the first substrate 1. The location of the recess is determined using the alignment marks 7 and the alignment notch 9 on the first substrate 1. In addition to an alignment notch 9, an alignment flat (not shown) may also be used. In particular, the recess 14 is etched to provide an accurately located reference surface. The reference surface is located so that in use, once the holder 5 has been inserted in the recess 14, the second substrate 2 is located at a predetermined position with respect to the patterned radiation beam. Thus, the location of the second substrate 2 can be very accurately determined. Preferably, the recess 14 is created in alignment with the crystal orientation in the second substrate 2. The orientation of the second substrate 2 is such that the patterns to be exposed on the second substrate 2 are parallel or perpendicular to the crystal orientation of the second substrate. The edge sensor in the lithographic apparatus is used for pre-alignment of substrate 1. The notch 9 or flat is determined accurately. Further, a grid is used by exposing the alignment marks on substrate 2 to define a grid. The location for the second substrate 2, in particular the reference surface is determined by alignment with the alignment markers of substrate 2. The recess 14 is etched typically to a depth of about 100 micrometers. A reactive ion or plasma etching technique may be used. In this way the relatively large area can be etched over a substantially constant depth. In the embodiment shown in FIG. 2, the etched area is a "U" shape. A substrate holder 5 is disposed in the recess 14 for retaining the second substrate 2 on the polished surface 3 of the first substrate 1 in the predetermined location. The recess 14 is preferably dimensioned to be slightly larger than the substrate holder 5 in the x-y plane. An advantage of this arrangement is that dirt and other contaminants do not interfere with the disposal of the holder 5 in the recess 14. The holder 5 may be made of a metal, plastic, or ceramic material. Relatively inert metals or ceramics, such as stainless steel and zerodur (trade mark), respectively provide good results, since they may be made to the appropriate thinness without warping. Further, these materials retain their shape. The holder 5 preferably has a flat surface in the x-y plane and, in an embodiment, is of a substantially uniform thickness of approximately 0.3 to 0.4 millimeters. The holder 5 may be machined using a lasering technique to very accurately determined dimensions. By providing a recess and a holder, accurate alignment is achieved with relatively low cost. In one embodiment, the holder 5 comprises at least one alignment surface 4 with respect to which the second substrate is aligned. The alignment surface 4 is machined on the holder so that in use, when the holder 5 is disposed on the reference surface in the recess, the alignment surface 4 is disposed so that when the second substrate 2 is disposed in the holder 5, the second surface is accurately aligned with the patterned beam. A further advantage of the holder according to embodiments of the present invention is that it is not fragile. Further, the recess area is designed to be dimensioned slightly larger in the x-y plane than the holder.

Figure 3:
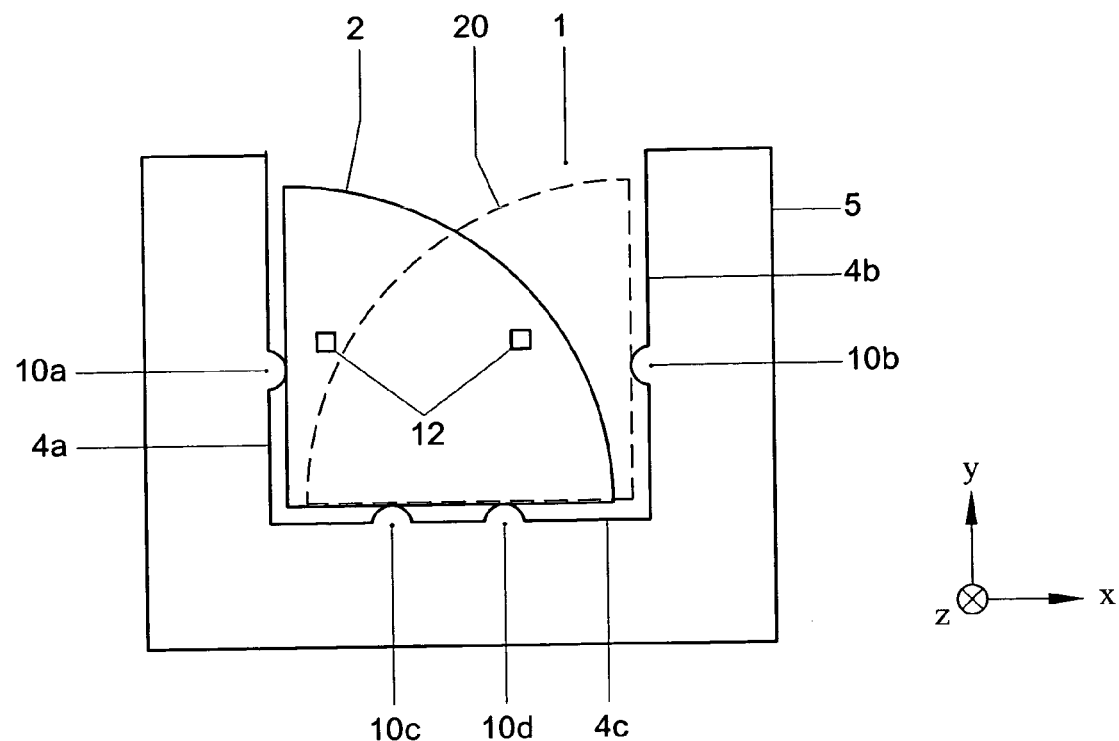
FIG. 3 depicts a plan view of a substrate holder for holding a second substrate according to an embodiment of the invention.

FIG. 3 depicts a plan view of a substrate holder for holding a second substrate according to an embodiment of the invention. In the embodiment shown, the alignment surface 4a, 4b, 4c comprises at least one contact point 10a, b, c, d, wherein the second substrate 2 is disposed in contact with the at least one contact point 10a, b, c, d. In one embodiment, the alignment surface 4a, 4b, 4c comprises a first and a second portion 4a, 4b, 4c extending in mutually different directions, respectively, wherein the two portions comprise at least one contact point 10a, b, c, d. In a further embodiment, the alignment surface 4a, 4b, 4c comprises a first and a second portion, wherein a first contact point 10c, d is disposed on the first portion 4c facing a first end of the second substrate 2 and a second contact point 10a is disposed on the second portion 4a facing a second end of the second substrate. In a further embodiment, the first portion 4c is provided with two contact points 10c, 10d. In one embodiment, the second substrate 2 is held in position against three contact points 10a, 10c, 10d. In this way, the stability of the second substrate in its held position is improved. The contact points are designed such that positioning is more accurate than positioning the substrate in an etched recess. In conventional holders, where the substrate is placed in the recess area and positioned against the edges of the recess area, fragile edges are easily damaged resulting in inaccurate positioning and contamination.

It is desirable to provide contact points 10 on the substrate holder 5 because, for example, the substrate holder may not be perfectly straight. For example, the substrate holder may not have an exact 90 degree angle, or it may be costly to produce substrate holders with exactly 90 degree angles. The contact points 10 provide a cost effective way to correct for any deviation and/or more importantly, ensure reproducibility. The contact points 10 ensure that regardless of any deviations, the second substrate 2 is placed on the first or carrier substrate 1 in the same position. Further, since the area with which the contact points 10 contact the second substrate 2 is relatively small, the chances of contamination coming between the contact points and the second substrate is small. Also, as the second substrate 2 may be secured to the first substrate 1 by a drop of liquid, for example, water, the contact points ensure that there is some space for water leaking from underneath the substrate 2 when the substrate is pressed onto the carrier substrate 1. As mentioned, the second substrate may be maintained in the predetermined location by a drop of a liquid, such as water. Deionized water may be used. It has been found that capillary action caused by the drop of water with respect to the first and second substrates 1, 2 keeps the second substrate 2 in place. The second substrate 2 may be removed by heating the substrate to cause evaporation of at least part of the drop. Release holes may also be provided in the substrate 1 to facilitate release and removal of the second substrate 2. For example, a vacuum may be applied to the release holes to suck the second substrate 2 from the first substrate 1.

In FIG. 3 it is seen that the holder 5 has a "U" shape. The holder has an alignment surface 10 comprising three portions 10, 10c, 10d. In the embodiment shown, the second substrate 2 is a quarter portion of a full circular substrate. The "U" shape is provided so that when a further quarter portion originating from a quadrant adjacent to the quarter shown in FIG. 3, it may be disposed in the orientation shown by dotted line 20. In this way, the crystal orientation of the original substrate is maintained. This is desirable, in particular, for InP substrates.

Figure 4:
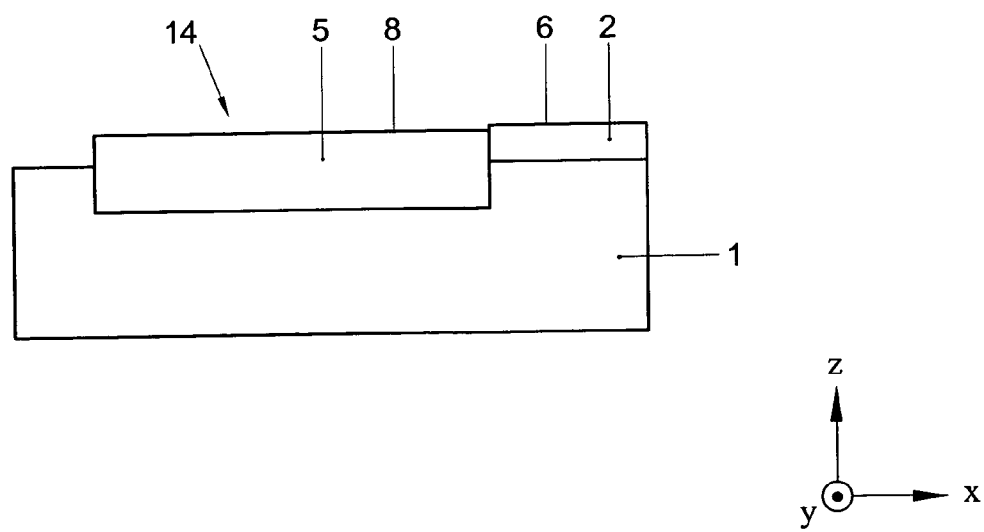
FIG. 4 depicts a cross section of a second substrate held in a holder on a first substrate according to an embodiment of the invention.

FIG. 4 depicts a cross section of a second substrate held in a holder on a first substrate according to an embodiment of the invention. In particular, it is seen how the holder 5 is disposed in the recess 14. It is seen that in this one embodiment, the recess 14 and the holder 5 are dimensioned so that the holder 5 extends in the z-direction to an extent substantially equal to the thickness of the second substrate 2. In other words, the recess 14 and holder 5 are dimensioned with respect to the second substrate 2 so that in use, an upper surface 6 of the second substrate is substantially flush with an upper surface 8 of the holder. Further, the holder and recess may be dimensioned with respect to the second substrate, so that in use, the height of the holder does not exceed the height of the second substrate. In this way, the chances of minimizing collisions of the substrates with the projection lens are minimized.

FIG. 5a depicts a top view of a recess area according to an embodiment of the invention and FIG. 5b depicts a side view of the recess area depicted in FIG. 5a. In particular, these figures show the dimensions of the recess. The recess is dimensioned for a substrate holder for holding portions of a substrate, which might have originally measured 2 inches in diameter. The "U" shaped recess 14 comprises a first portion 14a, a second portion 14b and a third portion 14c. The first and second portions 14a, 14b are the arms of the "U" extending in the x direction. The third portion 14c is the base of the "U" extending in the y direction. The recess is etched so that its dimensions are slightly larger than the holder 5, which is to fit into the recess. For example, the first and second portions 14a, 14b have a width extending in the y direction of 9.1 mm. The distance in the y direction between the first and second portions 14a, 14b is 26.9 mm. The length of the third portion 14c in the y direction is 45.1 mm. The width of the third portion 14c in the x direction is 9.1 mm. The length of the first and second portions 14a, 14b in the x direction is 27 mm. In FIG. 5b it is seen that the depth of the etched recess 14 in the z direction is 0.1 mm and the length in the y direction of the etched recess is 45.1 mm. The dimensions given may vary. It will be understood that other dimensions for the recess are envisaged and will depend on the dimensions of the substrates or portions of substrates that are intended to be held by the holder to be fitted into the recess.

Figure 6:
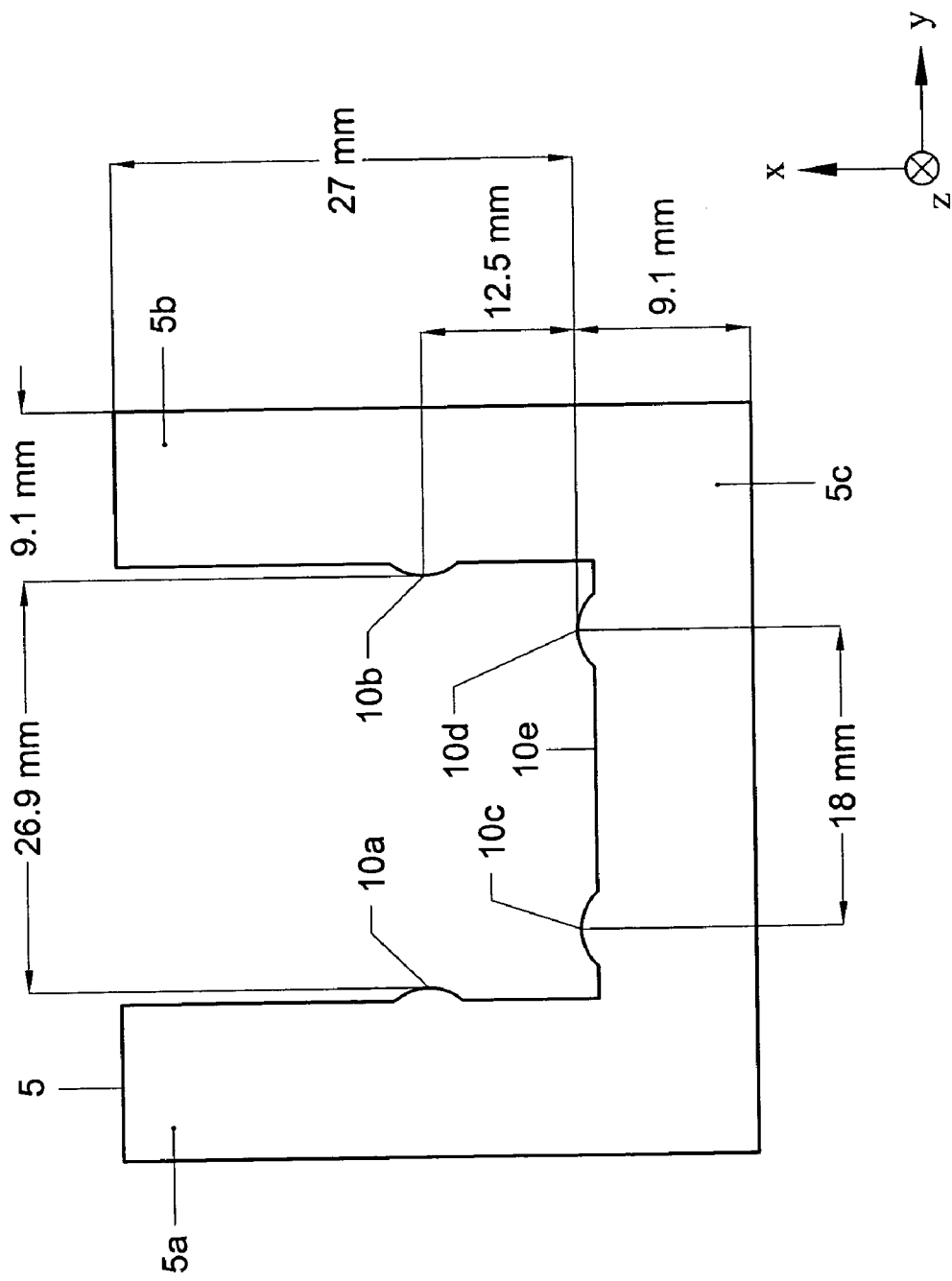
FIG. 6 depicts a detailed plan view of a substrate holder for disposal in the recess shown in FIGS. 5a and 5b according to an embodiment of the invention.

FIG. 6 depicts a detailed plan view of a substrate holder for disposal in the recess shown in FIGS. 5a and 5b according to an embodiment of the invention. According to an embodiment of the invention, the holder is configured to surround, in use, the second substrate on at least two sides. In this way, the second substrate may be held securely and accurately in a predetermined location. The holder comprises a first, second and third portion 5a, 5b, 5c. The first and second portions are the arms of the "U" shape. The first and second portions extend in the x-direction. The third portion 5c is the base of the "U" shape. The third portion 5c extends in the y direction. The width of the first and second portions in the y direction is 9.1 mm. The length of the first and second portions 5a, 5b in the x direction is 27 mm. FIG. 6 further shows the location of contact points 10a, b, c, d. A first contact point 10a is located on the first portion 5a. A second contact point 10b is located on the second portion 5b. A third and a fourth contact point 10c, 10d are located on the third portion 5c. The first and second contact points 10a, 10b may be located at a distance in the x direction along the first and second portions 5a, 5b, respectively. In the embodiment shown, the first and second contact points 10a, 10b are located 12.5 mm along the first and second portions, respectively. In other words, they are located 12.5 mm from the inner edge 10e of the third portion 5c. The length of the inner edge 10e is 26.9 mm. Two contact points 10c, 10d are located on the third portion 5c. The contact points 10c, 10d are located 18 mm apart from one another and equidistant from the ends of the third portion. It will be understood that other dimensions for locations of the contact points are envisaged and will depend on the dimensions of the substrates or portions of substrates that are intended to be held by the holder.

Figure 7:
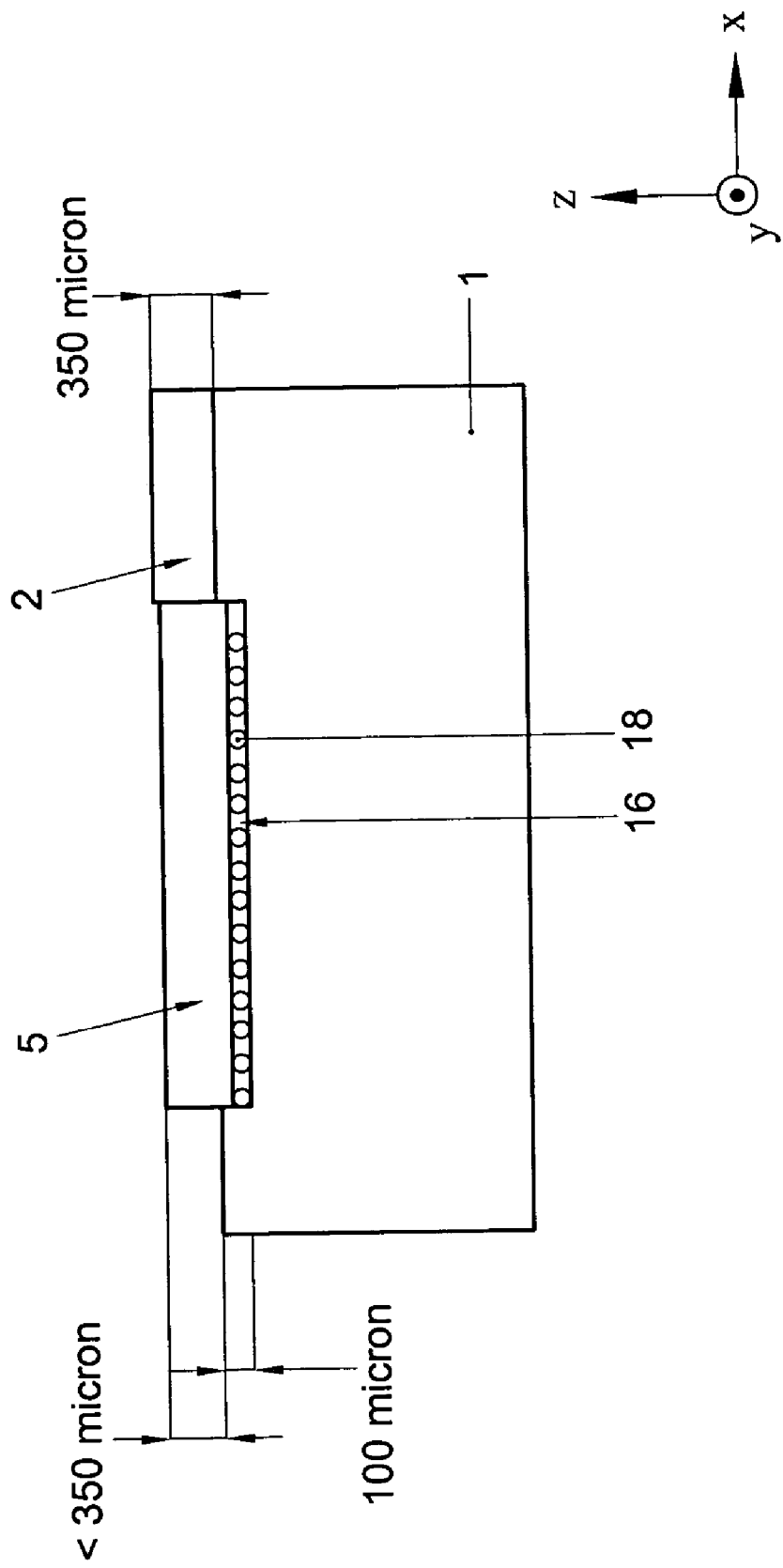
FIG. 7 depicts a cross section of a second substrate held in a holder on a first substrate according to an embodiment of the invention.

FIG. 7 depicts a cross section of a second substrate held in a holder on a first substrate according to an embodiment of the invention. In particular, the holder 5 may be glued into the recess 14 using an adhesive 16 and pearl 18 composite. The adhesive may be an epoxy glue. The pearls are provided to control the thickness of the adhesive layer. The pearls 18 may have an approximate diameter of 8 micrometers. By providing a glue comprising pearls, the holder can be glued directly into the recess. The pearl/adhesive composite further corrects for any unevenness of the recess surface. In the embodiment shown, the thickness of the second substrate 2 is 350 micrometers. In an embodiment, the holder 5 extends above the surface of the first substrate 1 by an amount less than 1000 micrometers, e.g. less than 600 micrometers or less than 350 micrometers. The thickness of the recess, in an embodiment, is about 100 micrometers. It will be understood that these dimensions may vary depending on each particular embodiment.

FIGS. 8a-8d show the formation of a holder 5 disposed in a recess 14 according to an embodiment of the present invention.

Figure 8A:
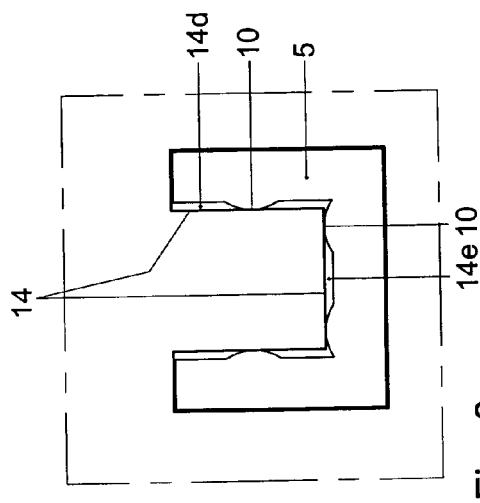
FIG. 8a depicts a plan view of a recess formed in a first substrate according to an embodiment of the invention.
Figure 8C:
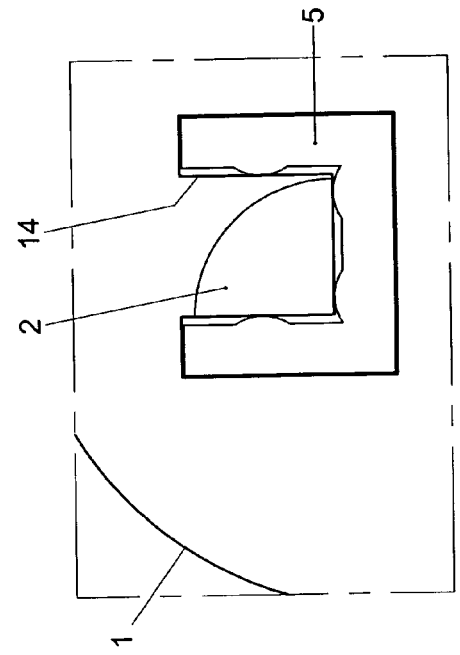
FIG. 8c depicts a detailed plan view of a holder according to an embodiment of the invention.
Figure 8B:
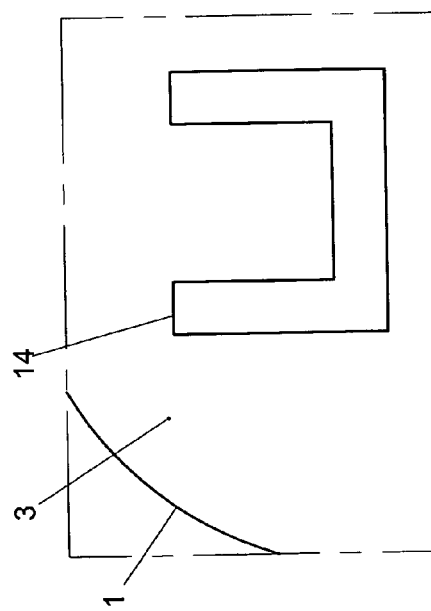
FIG. 8b depicts a plan view of a holder according to an embodiment of the invention.
Figure 8D:
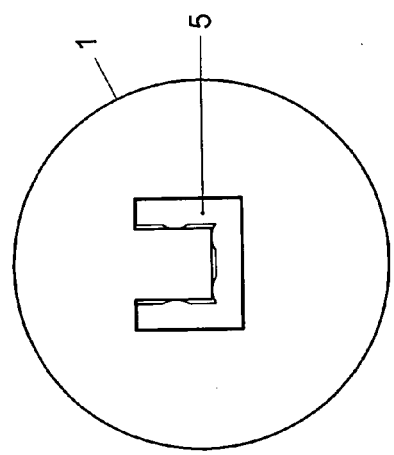
FIG. 8d depicts a plan view of a second substrate mounted on a first substrate according to an embodiment of the present invention.

FIG. 8a depicts a plan view of a recess formed in a first substrate according to an embodiment of the invention. In particular, a recess is shown in the polished surface 3 of the first substrate 1. FIG. 8b depicts a plan view of a holder according to an embodiment of the invention. The metal holder 5 is disposed in the recess 14. FIG. 8c depicts a detailed plan view of a holder according to an embodiment of the invention. In particular, the recess 14 is slightly larger in the x-y plane than the holder 5. The gaps 14d, 14e are shown between the edges of the recess 14 and the holder 5 disposed in the recess 14. FIG. 8d depicts a plan view of a second substrate 2 mounted on a first substrate according to an embodiment of the present invention.

With reference to FIGS. 9 to 12, the holder 50 comprises a first portion 50a which extends in a first direction and a second portion 50b which extends in a direction substantially perpendicular to the first direction ("L" shaped), wherein the portions 50a, 50b have a predetermined thickness extending in a third direction. It is noted that only the geometry of the recess and holder differ from those embodiments described with reference to FIGS. 2 to 8. The recess 24 and holder 50 are formed and function in the same or similar manner as the recess and holder described with reference to FIGS. 2 to 8.

Figure 9:
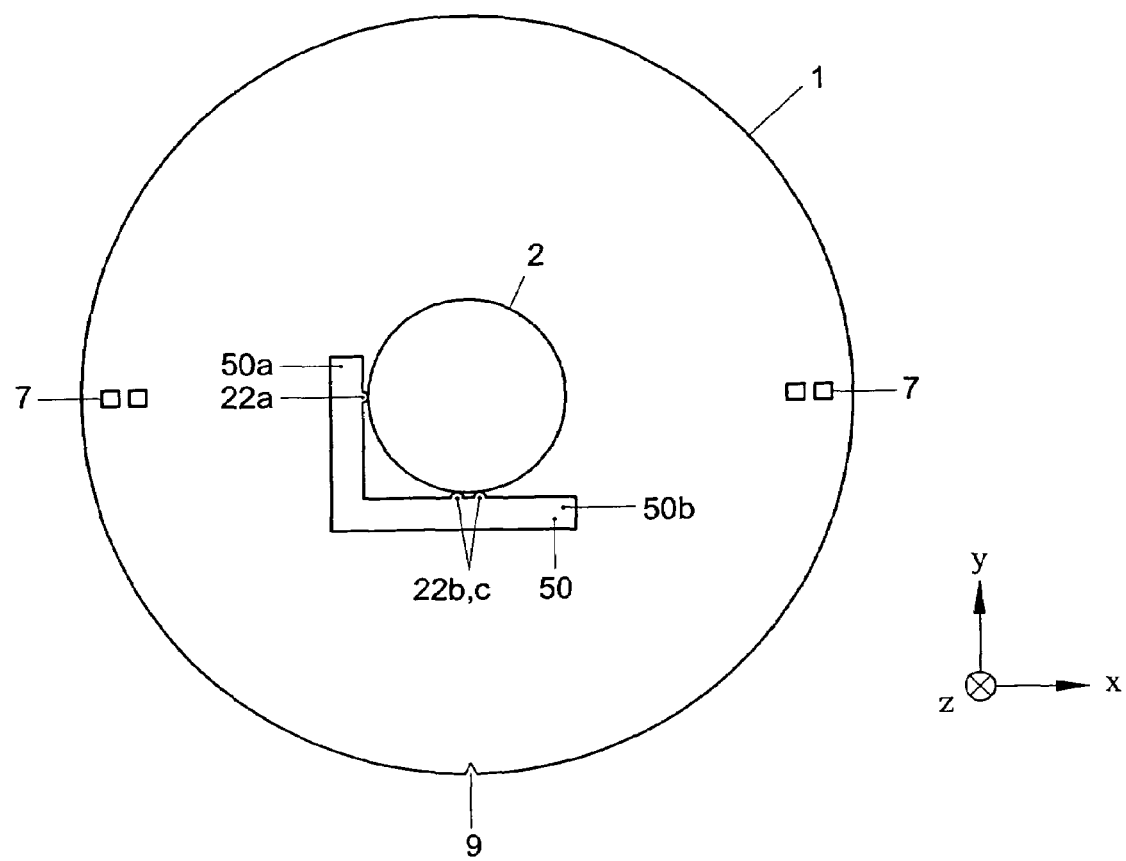
FIG. 9 depicts a plan view of a first substrate on which a second substrate is mounted according to a further embodiment of the invention.

FIG. 9 depicts a plan view of a first substrate on which a second substrate is mounted according to a further embodiment of the invention. The holder 50 shown in FIG. 9 typically holds a second circular substrate 2. For example, the first substrate 1 may be a 6 or 8 inch diameter substrate, whereas the second substrate 2 may be a circular 2 inch silicon, or otherwise, substrate. As in FIG. 2, alignment marks 7 and an alignment flat or notch 9 are provided on the first substrate 1 to facilitate alignment of the first substrate 1. The second substrate 2 is aligned with respect to the pre-alignment marks 7 and flat or notch 9 on the first substrate 1. Pre-alignment takes place with the markers on substrate 1 and global alignment takes place on the markers of substrate 2. An "L" shaped recess 24 is etched in the first substrate 1 to a depth of approximately 100 micrometers. The L shaped holder 50 is disposed in the recess. The L shaped holder 50 comprises a first portion 50a extending substantially in the y direction and a second portion 50b extending substantially in the x direction. A contact point 22a is disposed on the first portion 50a. Two contact portions 22b, c are disposed on the second portion 50b.

Figure 10:
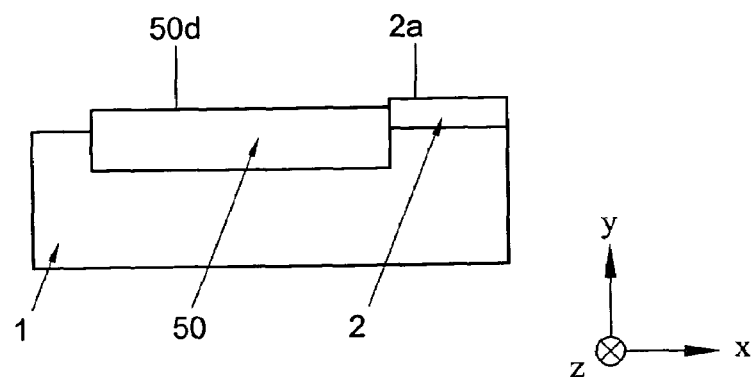
FIG. 10 depicts a cross section of the embodiment depicted in FIG. 9.

FIG. 10 depicts a cross section of the embodiment depicted in FIG. 9. The holder 50 is disposed in the recess in the first substrate 1. The second substrate 2 is disposed on the polished surface 3 of the first substrate 1 and abuts the holder 50. The holder 50 is located at the predetermined position and holds the second substrate 2. As with the embodiment shown in FIG. 4, the recess and holder 50 are dimensioned so that an upper surface 50c of the holder 50 is substantially flush with an upper surface 2a of the second substrate 2.

Figures 11A, 11B:
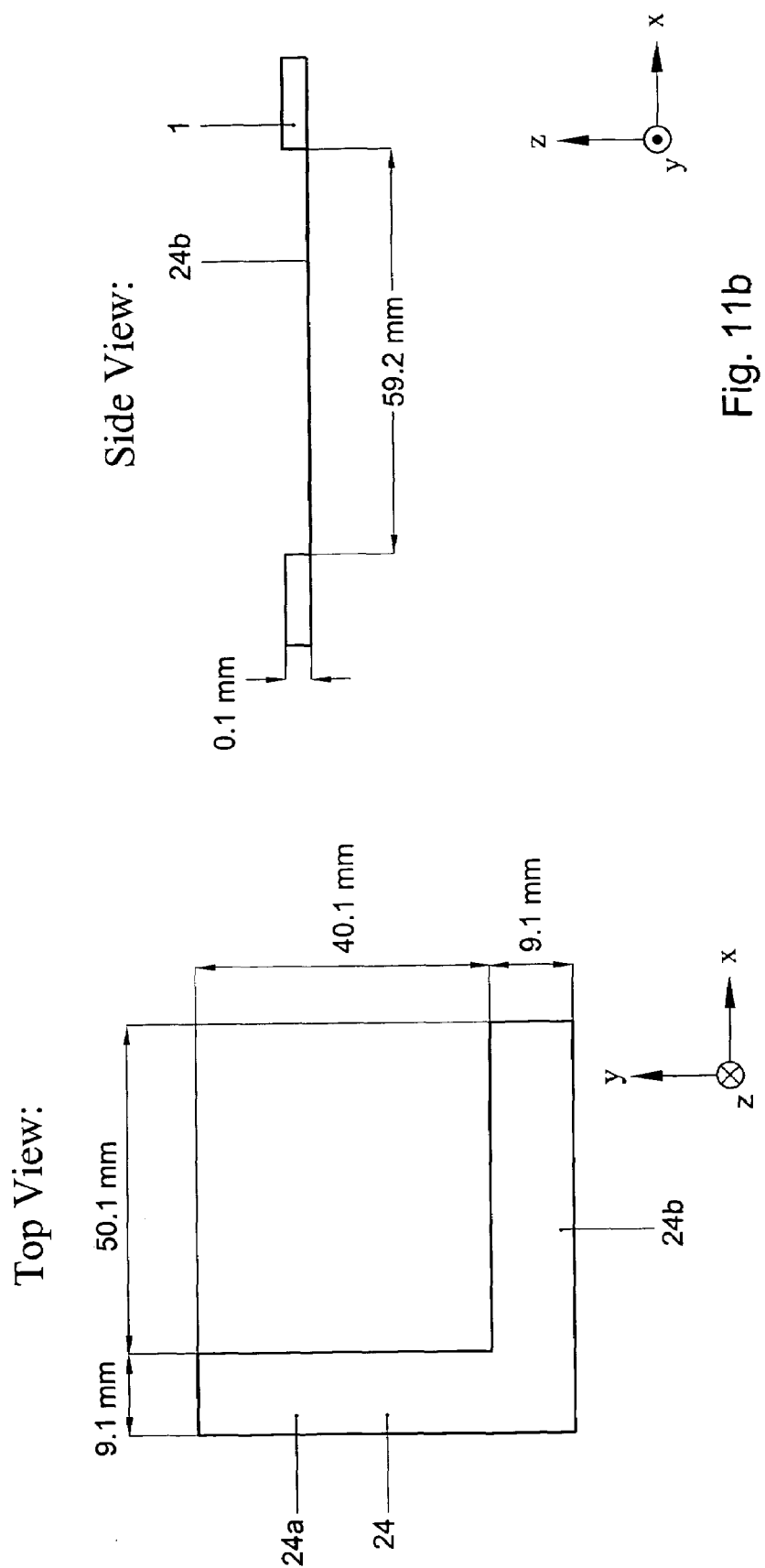

FIG. 11a depicts a top view of the recess area according to the embodiment of the invention depicted in FIG. 9, and FIG. 11b depicts a side view of the recess area depicted in FIG. 11a. The L shaped recess 24 comprises a first portion 24a and a second portion 24b. The first portion 24a extends substantially in the y direction and the second portion 24b extends substantially in the x direction. The first portion 24a has a length of 40.1 mm in the y direction. The first portion 24a has a width of 9.1 mm in the x direction. The second portion 24b has a length of 50.1 mm in the x direction. The second portion has a width of 9.1 mm in the y direction. The recess 24 is etched to a depth of 0.1 mm in the z direction. The recess 24 is dimensioned to accommodate the holder 50 leaving a small gap around certain edges of the holder.

Figure 12:
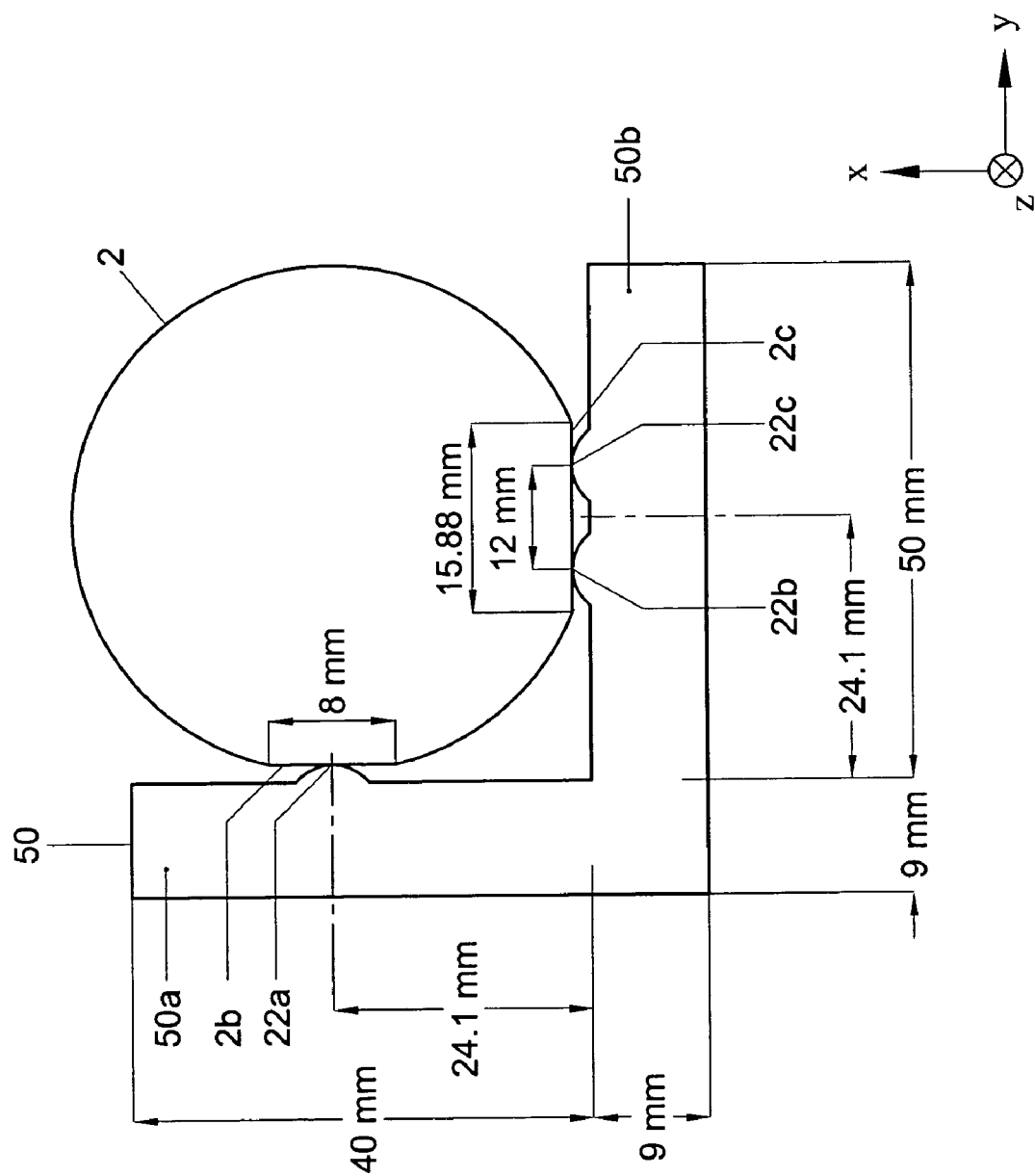
FIG. 12 depicts a detailed plan view of a substrate holder according to the embodiment of the invention depicted in FIG. 9.

FIG. 12 depicts a detailed plan view of a substrate holder according to the embodiment of the invention depicted in FIG. 9. The holder 50 is for disposal in the recess 24 shown in FIGS. 11a and 11b. The holder 50 comprises a first and second portion 50a, 50b. The first portion 50a extends in the x-direction. The second portion 50b extends in the y direction. The width of the first portion in the y direction is 9 mm. The length of the first portions 50a in the x direction is 40 mm. The length of the second portion 50b in the y direction is 59 mm. The width of the second portion 50b in the x direction is 9 mm. The holder comprises contact points 22a, b, c. A first contact point 22a is located on the first portion 50a. A second and third point 22b, 22c are located on the second portion 50b. The contact points 22 are located so that they are adjacent with flat portions 2b, 2c on the second substrate. For the second substrate shown, a second flat portion 2b has a length of 8 mm. The first flat portion 2c has a length of 15.88 mm. The first contact point 22a is arranged to be adjacent the second flat portion 2b. The second and third contact points 22b, c are arranged to be adjacent the first flat portion 2c. The third contact point 22c may be dispensed with. Also, further contact points may be provided. In the example shown, the first contact point 22a is located at a distance in the x direction along the first portions 50a of 24.1 mm. The second and third contact points 22b, c are spaced at a distance of 12 mm from each other. The second contact point 22b is at a distance of 27.1 mm in the y direction along the second portion 50b. The third contact point 22c is at a distance of 39.1 mm in the y direction along the second portion 50b. It will be understood that other dimensions for locations of the contact points are envisaged and will depend on the dimensions of the substrates or portions of substrates that are intended to be held by the holder.

Figure 13A:
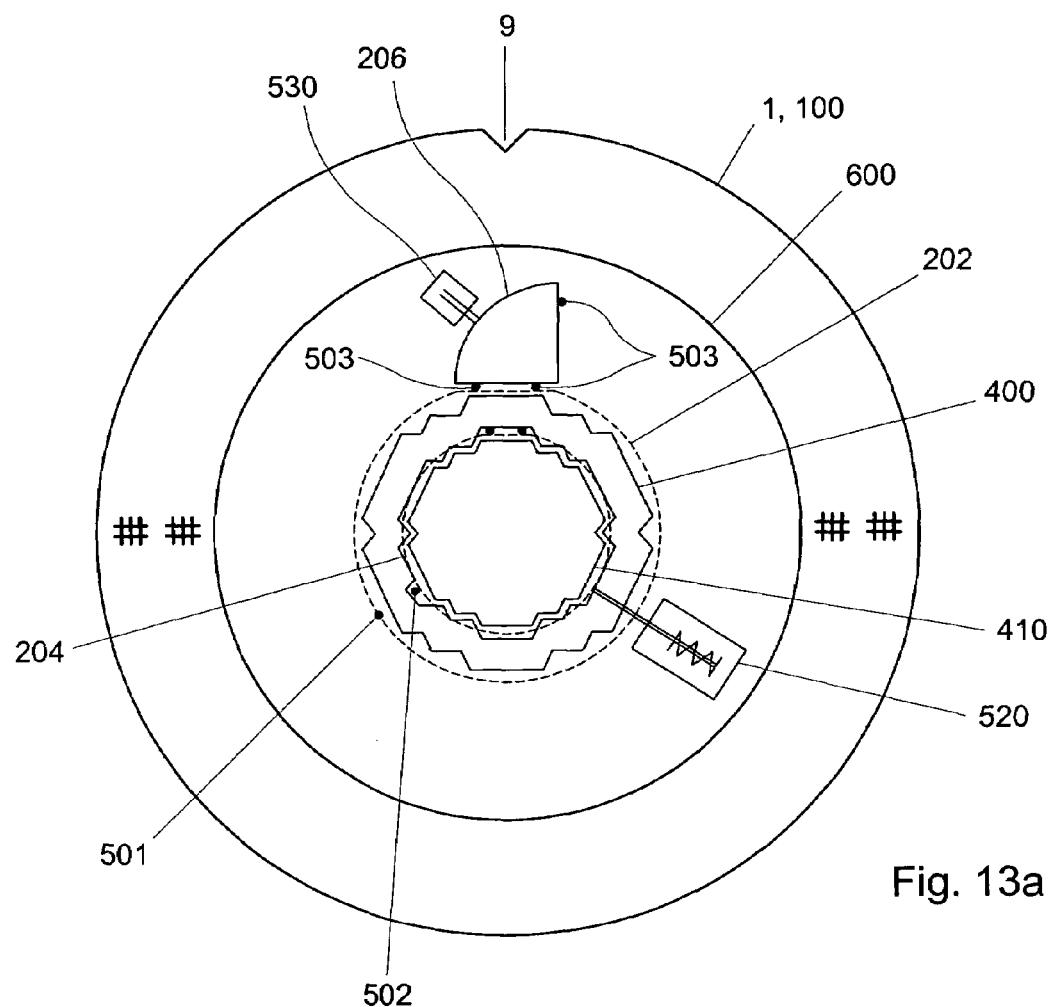
FIG. 13a depicts a plan view of a first and second substrate and substrate holders according to a further embodiment of the invention.
Figure 13B:
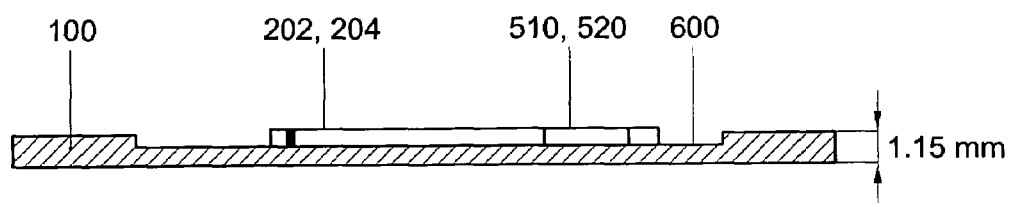

FIG. 13a depicts a plan view of a first and second substrate and substrate holders according to a further embodiment of the invention, and FIG. 13b shows a cross section of the embodiment shown in FIG. 13a. A first substrate 100 is provided having a notch 9. Typically, the first substrate has an 8 inch diameter. A recess 600 may be provided in the first substrate. Slideable clamps 520, 530 are provided for mechanically clamping a second substrate 202, 204, 206. The second substrate may comprise a 3 inch substrate 202, a 2 inch substrate 204 or quarters of a 2 inch substrate 206. The second substrate 202, 204, 206 may be disposed directly on the polished surface of the first substrate 1. In an alternative embodiment, as described further with reference to FIGS. 14-16, the second substrate may be disposed on a plurality of burls forming a pattern to support the second substrate. The second substrate 202, 204, 206 may be disposed in the recess 600, as seen in FIGS. 13-16. Similarly, the slideable clamps 520, 530, vacuum areas 400, 410 and substrate pins 501, 502, 503 may be disposed in the recess 600. Depending on which second substrate type is to be exposed, substrate pins 501, 502, 503 are provided at the appropriate predetermined locations to hold the second substrate 202, 204, 206 in place. In a further embodiment, vacuum areas 400, 410 are provided to further hold the second substrate 202, 204, 206 in place. The vacuum areas 400, 410 are generated by a vacuum pump and a controller. A series of holes formed in the first substrate 1, through which gas is extracted to form a vacuum or partial vacuum, define the vacuum areas. A vacuum is established by a relatively low pressure. The second substrate 202, 204, 206 is disposed on an appropriate vacuum area for its size. The substrate holder may also include alignment marks so that the offset between substrates clamped and the holder can be predetermined. In this way, time is saved in the lithographic apparatus. In FIG. 13b it is seen that the height of the first substrate 1 is 1.15 mm. The second substrate 202, 204, 206 being disposed directly on the first substrate 1.

Figure 14:
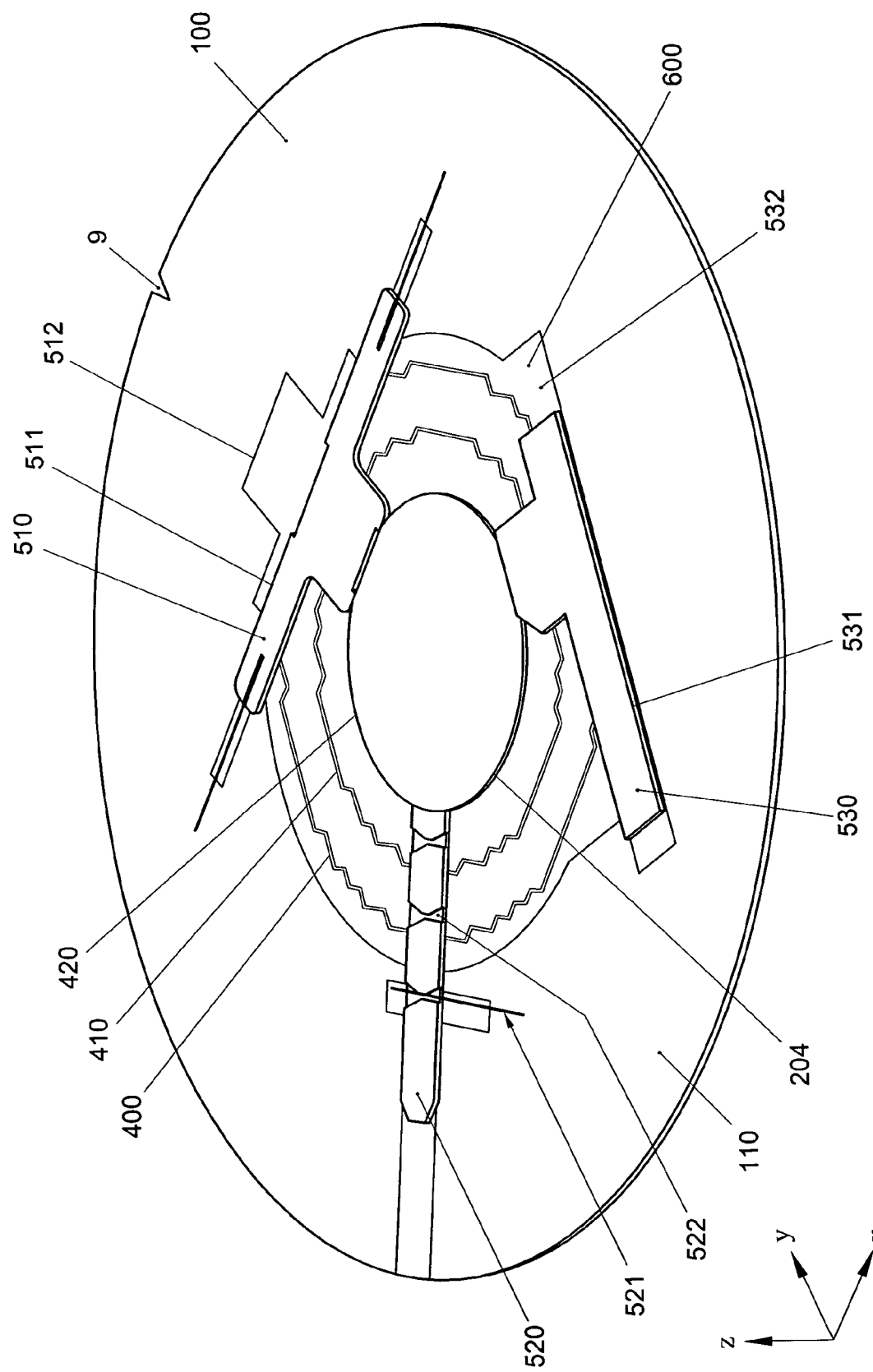
FIG. 14 depicts a plan view of a substrate supporting means according to a further embodiment of the invention.
Figure 15:
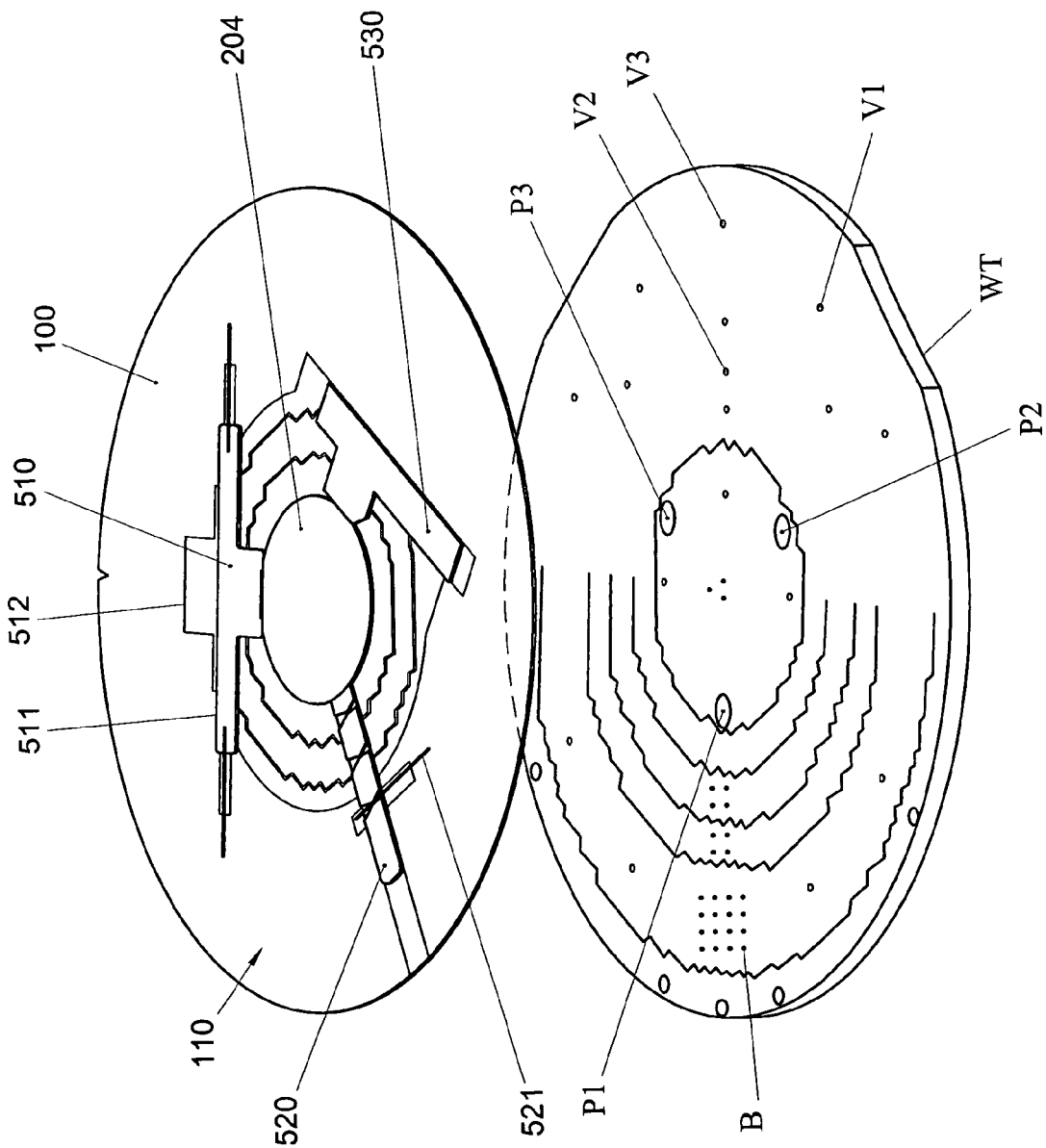
FIG. 15 depicts a plan view of a substrate table and a substrate supporting means according to the embodiment shown in FIG. 14.

FIG. 14 depicts a plan view of a substrate supporting means according to a further embodiment of the invention. FIG. 15 depicts a plan view of a substrate table and a substrate supporting means according to the embodiment shown in FIG. 14, and FIG. 16 depicts a plan view of details of a substrate supporting means according to a further embodiment of the invention.

Figure 16:
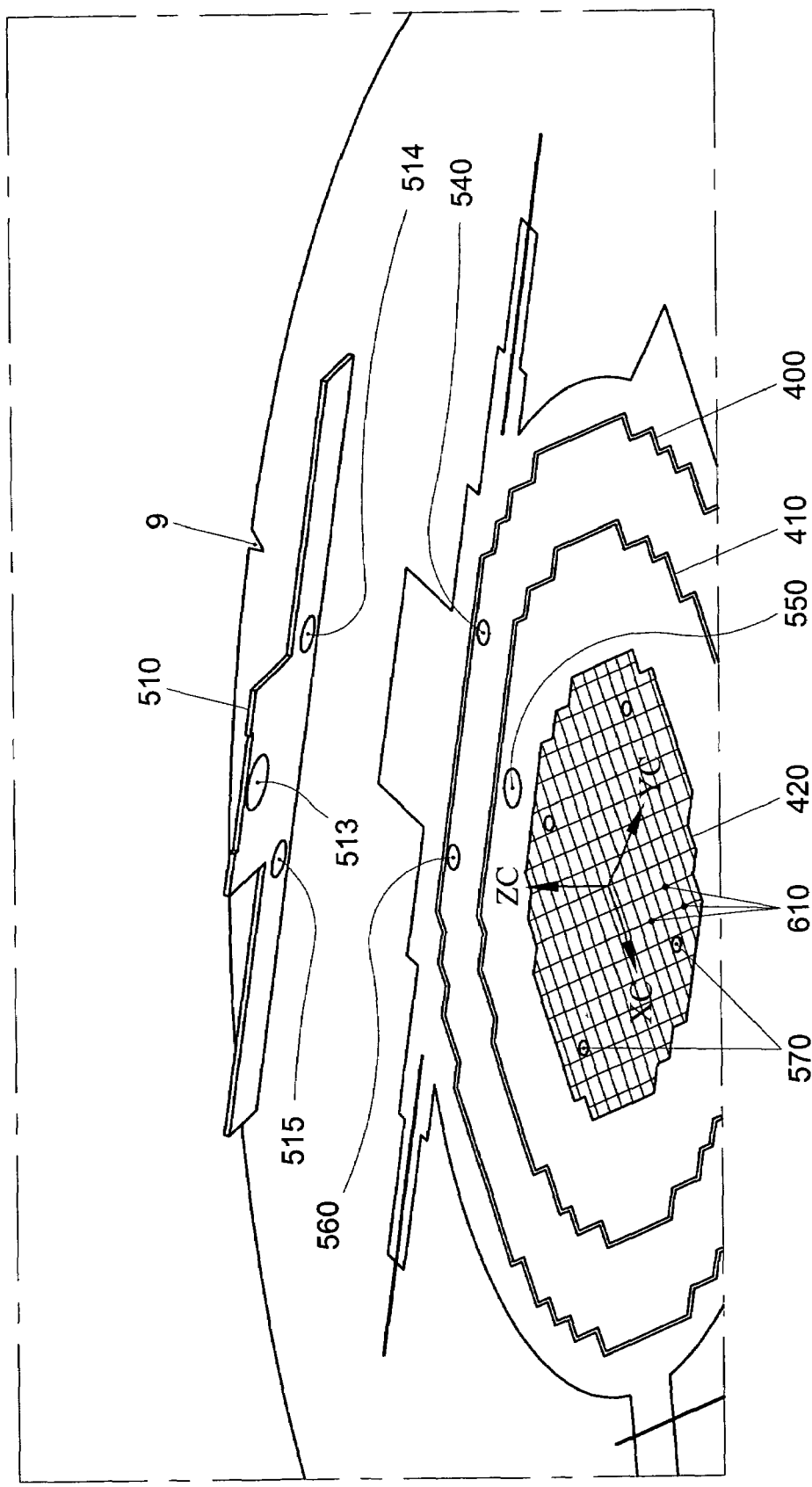
FIG. 16 depicts a plan view of details of a substrate supporting means according to a further embodiment of the invention.

In particular, in accordance with an embodiment of the invention shown in FIGS. 14-16, there is provided a substrate supporting means 100 for supporting a substrate, the substrate supporting means has an upper surface 100. The upper surface comprising a recess 600 in which a substrate holder 510, 520, 530, 540, 550, 560 and the substrate are disposed, so that the substrate is supported and held in a predetermined position by the holder 510, 520, 530, 540, 550, 560 to allow the target portion to be projected onto by the projection system. The substrate supporting means 100 comprises an intermediate plate-like member for supporting a substrate of a second type. In one embodiment, the intermediate plate-like member 100 is disposed on a substrate table WT constructed to hold a substrate of a first type, as shown for example, in FIG. 15. In an alternative embodiment, the substrate supporting means 100 may be integrally formed in a substrate table WT. The substrate table and the intermediate plate-like member may be made of the same material. Typically, the plate-like member 100 is made of quartz, but other material like SiC are also suitable. The plate-like member 100 has a thickness in the z-direction of around 1 mm. The recess is provided in a central region of the substrate supporting means. The recess has a depth of around 500 micrometers. When a substrate having a thickness of approximately 650 micrometers is disposed in the recess, the combined height of the substrate supporting means 100 and the substrate is around 1.15 mm. In a further embodiment, the recess is provided with a burl pattern 610 on which the substrate is disposed. The burl pattern may be formed by discharge erosion, such as etching. The average burl height is typically around 100 micrometers. In an alternative embodiment, the recess may comprise a polished surface for supporting the substrate.

In the embodiments shown in FIGS. 13-16, the substrate supporting means 100 may be regarded as an adaptor which is capable of supporting a variety of sizes of substrates of different types and sizes. By the provision of a holder which may comprise a plurality of vacuum areas and holding portions which are disposable in a variety of positions to select a particular vacuum area to hold a particular substrate, a flexible wafer holder is provided with universal application. FIG. 15 depicts vacuum holes V1, V2, V3 through which gas is sucked in order to crate a low pressure region underneath the substrate supporting member 100. The wafer table WT is further provided with pin holes P1, P2, P3 to lift the wafer or wafer holder up and down. The wafer table WT may further be provided with a burl pattern for supporting the substrate supporting means 100. The substrate supporting member 100 may also be provided with vacuum holes 540, 550, 560, as shown in FIG. 16, through which gas can be sucked in order to create a low pressure region underneath the substrate 204. In particular, the holder 100 further comprises a plurality of vacuum areas 400, 410 having at least first and second dimensions 400, 410 on which at least a first and second substrate can be disposed, respectively. Further, the dimensions of the vacuum area are controlled in order to be able to hold various sizes of substrate. In particular, the holder may comprise at least one of a first, second and third portion 510, 520, 530 for supporting a plurality of different substrates, wherein the at least one of a first, second and third portion 510, 520, 530 is positionable in a plurality of positions 511, 512, 521, 522, 531, 532 in order to support the plurality of different substrates. For example, as seen in FIG. 16, the first portion can be rotated between a first position 511 and a second position 512 to control the size of the vacuum area. First portion 510 comprises pads 513, 514, 515 for sealing the vacuum holes 550, 540, 560, respectively. In a first position 511, the seals seal the vacuum holes 540, 550, 560. Vacuum holes 570 are left uncovered, to provide a vacuum area 410 on which substrate 204 may be disposed. First, second and third portions 510, 520, 530 provide holding edges to hold the substrate 204 in place. In particular, the second and third portions 520, 530 are translatable between first and second positions, respectively. Thus, the substrate 204 may then be held on the substrate supporting member 100. In particular, the first portion 510 is positionable so that in a first position 511 the first portion 510 defines a first vacuum area 420 for holding a first substrate 204 and in a second position 512, the first portion 510 defines a second vacuum area 400 for holding a second different substrate 202. A third further vacuum area 410 is also provided. The first portion 510 may be rotatable between the first and second positions 511, 512. In FIG. 16, it is seen that when the first portion 510 is rotated to the second position, the vacuum holes 540, 550, 560 are uncovered, forming a vacuum area 400 over which a larger substrate can be disposed. Further, at least one of the second and third portions 520, 530 are translatable between a first position 521, 531 for holding a first substrate and a second position 522, 532 for holding a second different substrate. In particular, the second portion comprises a spring, or a pusher, for exerting a force on the substrate in a direction towards at least one of the first and third portions 510, 520. In FIG. 14, the substrate 204 shown is a 2 inch InP wafer. The substrate supporting member 100 is able to support 2-4 inch InP wafers. Vacuum area 410 supports a 2 inch wafer, vacuum area 410 supports a 3 inch wafer and vacuum area 420 supports a 3 inch wafer. In the embodiments shown, alignment is achieved using notch 9.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of types of optical components, including refractive, reflective, magnetic, agnetic and electrostatic optical components.

The descriptions above are intended to be illustrative, not limiting. Thus, it will be to one skilled in the art that modifications may be made to the invention as described departing from the scope of the claims set out below.

What is claimed is:

1. A lithographic apparatus comprising:
   a substrate table constructed to hold a first substrate of a first type, the first substrate having a polished surface; and
   a projection system configured to project a patterned radiation beam onto a target portion of a substrate,
   wherein the polished surface supports a second substrate of a second type and the projection system is configured to project the patterned radiation beam onto the second substrate.

2. A lithographic apparatus according to claim 1, wherein the polished surface is substantially flat.

3. A lithographic apparatus according to claim 1, wherein a recess is formed in the polished surface of the first substrate.

4. A lithographic apparatus according to claim 3, wherein a substrate holder is disposed in the recess for retaining the second substrate on the polished surface of the first substrate in a predetermined location.

5. A lithographic apparatus according to claim 3, wherein the recess provides a reference surface with respect to which the holder is aligned, so that in use, the second substrate is retained in the predetermined position in alignment with respect to the patterned radiation beam.

6. A lithographic apparatus according to claim 4, wherein the holder comprises an alignment surface with respect to which the second substrate is aligned.

7. A lithographic apparatus according to claim 6, wherein the alignment surface comprises at least one contact point, wherein the second substrate is disposed in contact with the at least one contact point.

8. A lithographic apparatus according to claim 4, wherein the recess and holder are dimensioned with respect to the second substrate so that in use, an upper surface of the second substrate is substantially flush with an upper surface of the holder.

9. A lithographic apparatus according to claim 4, wherein the holder and recess are dimensioned with respect to the second substrate, so that in use, the height of the holder does not exceed the height of the second substrate.

10. A lithographic apparatus according to claim 7, wherein the alignment surface comprises a first and a second portion extending in mutually different directions, respectively, wherein the two portions comprise at least one contact point.

11. A lithographic apparatus according to claim 7, wherein the alignment surface comprises a first and a second portion, wherein a first contact point disposed on the first portion facing a first end of the second substrate and a second contact point is disposed on the second portion facing a second end of the second substrate.

12. A lithographic apparatus according to claim 11, wherein the first portion is provided with two contact points.

13. A lithographic apparatus according to claim 4, wherein the holder is configured to surround, in use, the second substrate on at least two sides.

14. A lithographic apparatus according to claim 4, wherein the holder comprises a first portion which extends in a first direction and a second portion which extends in a direction substantially perpendicular to the first direction, wherein the portions have a predetermined thickness extending in a third direction.

15. A lithographic apparatus according to claim 4, wherein the holder comprises a first portion which extends in a first direction and a second and third portions which adjoin the first portion at opposite ends and extend in substantially the same second direction, wherein the portions have a predetermined thickness extending in a third direction.

16. A lithographic apparatus according to claim 3, wherein the recess is etched.

17. A lithographic apparatus according to claim 4, wherein the holder is metal.

18. A lithographic apparatus according to claim 4, wherein the holder is glued into the recess using an adhesive and pearl composite.

19. A lithographic apparatus according to claim 1, wherein the second substrate is maintained in a predetermined location by a drop of liquid.

20. A lithographic apparatus according to claim 1, comprising a vacuum area on which the second substrate is disposed.

21. A lithographic apparatus according to claim 20, wherein the vacuum area is defined by a series of holes provided in the first substrate, a vacuum pump and a controller for extracting gas through the holes to create a low pressure region under the second substrate when it is disposed on the holes.

* * * * *